United States Patent
Hillier et al.

(10) Patent No.: US 10,310,989 B2
(45) Date of Patent: Jun. 4, 2019

(54) TIME TRACKING WITH PATROL SCRUB

(71) Applicant: INTEL CORPORATION, Santa Clara, CA (US)

(72) Inventors: Philip Hillier, Rancho Santa Margarita, CA (US); Jeffrey W. Ryden, Tustin, CA (US); Muthukumar P. Swaminathan, Folsom, CA (US); Zion S. Kwok, Vancouver (CA); Kunal A. Khochare, Folsom, CA (US); Richard P. Mangold, Forest Grove, OR (US); Prashant S. Damle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 15/721,379

(22) Filed: Sep. 29, 2017

(65) Prior Publication Data

US 2019/0102320 A1 Apr. 4, 2019

(51) Int. Cl.
*G06F 12/126* (2016.01)
*G06F 12/02* (2006.01)
*G11C 7/22* (2006.01)

(52) U.S. Cl.
CPC ........ *G06F 12/126* (2013.01); *G06F 12/0246* (2013.01); *G11C 7/22* (2013.01); *G06F 2212/7209* (2013.01)

(58) Field of Classification Search
CPC ............... G06F 12/126; G06F 12/0246; G06F 2212/7209; G11C 7/22

See application file for complete search history.

(56) References Cited

U.S. PATENT DOCUMENTS

| | | | |
|---|---|---|---|
| 8,605,531 B2 * | 12/2013 | Kau | G11C 8/10 365/148 |
| 9,230,982 B1 * | 1/2016 | Yuan | G11C 29/025 |
| 9,236,131 B1 * | 1/2016 | Yuan | G11C 16/10 |
| 9,336,892 B1 * | 5/2016 | Chen | G11C 11/5628 |
| 2012/0075924 A1 * | 3/2012 | Kau | G11C 13/0004 365/163 |
| 2012/0320670 A1 * | 12/2012 | Kau | G11C 8/10 365/163 |
| 2014/0006696 A1 * | 1/2014 | Ramanujan | G11C 13/0004 711/103 |
| 2016/0118131 A1 * | 4/2016 | Dong | G11C 16/3427 365/185.02 |
| 2017/0288885 A1 * | 10/2017 | Khatib Zadeh | H04L 9/3278 |
| 2018/0173588 A1 * | 6/2018 | Bacchus | G06F 12/02 |

* cited by examiner

*Primary Examiner* — Kyle Vallecillo
(74) *Attorney, Agent, or Firm* — Grossman, Tucker, Perreault & Pfleger, PLLC

(57) ABSTRACT

One embodiment provides a memory controller. The memory controller includes a memory controller memory; a timestamp circuitry and a demarcation voltage (VDM) selection circuitry. The timestamp circuitry is to capture a current timer index from a timer circuitry in response to an initiation of a periodic patrol scrub and to compare the current timer index to a stored timestamp. The VDM selection circuitry is to update a state of a sub-block of a memory array, if the state is less than a threshold and a difference between the current timer index and the stored timestamp is nonzero. The timestamp circuitry is further to store the current timer index as a new timestamp.

24 Claims, 4 Drawing Sheets

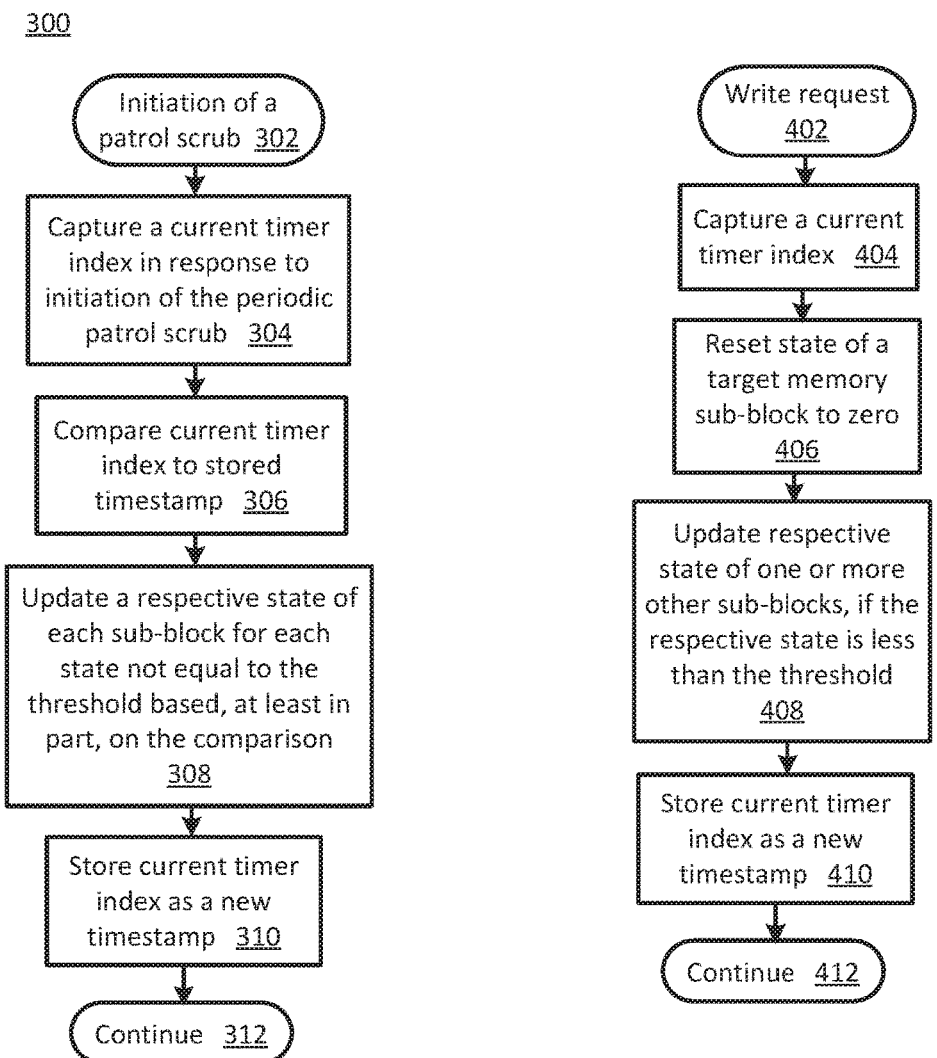

TIME TRACKING WITH PATROL SCRUB

FIELD

The present disclosure relates to time tracking, in particular to, time tracking with patrol scrub.

BACKGROUND

Volatile memory is configured to maintain stored information while powered. Non-volatile memory (NVM) may retain stored information after power is removed and the stored information may thus be available if power is again applied. Some types of NVM may utilize a read reference voltage for reading a memory cell. For example, a demarcation voltage (VDM) may be externally applied to a memory cell as a read reference voltage. The memory cells may be characterized by an associated threshold voltage (Vt), which indicates the minimum voltage at which the memory cell may allow current to flow. When a read reference voltage is applied to a target memory, an absence of current flow may be read as a logic one and a non-zero current flow may be read as a logic zero (or vice versa).

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 3 is flowchart of time tracking with patrol scrub operations according to various embodiments of the present disclosure;

FIG. 4 is a flowchart of time tracking write operations according to various embodiments of the present disclosure.

Figure 1:
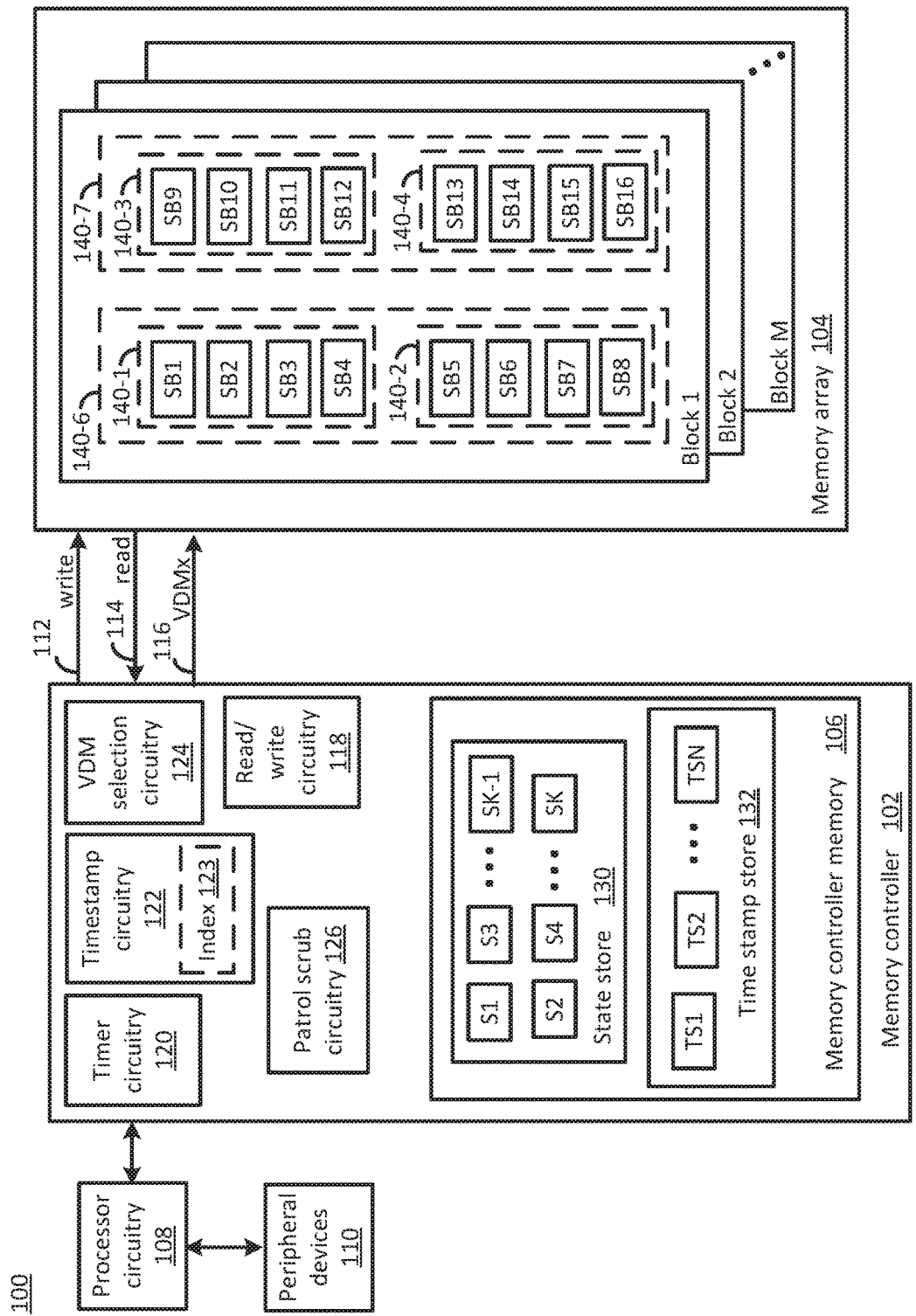
FIG. 1 illustrates a functional block diagram of a time tracking system consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

In some NVM technologies, the Vt may drift over time. A drift time interval for a memory cell may be measured from a last (i.e., most recent) write operation to a read operation. The respective ranges of memory cell threshold voltages that are associated with logic one or logic zero will change when their threshold voltages drift. Thus, a first VDM may be appropriate for a read operation relatively near in time to a write operation and a second VDM may be appropriate for a read operation relatively distant in time from the write operation. Accurately reading a target memory cell relies on applying an appropriate read reference voltage. A read operation may occur at any time relative to a write operation.

Generally, an NVM memory array may include on the order of ones, tens, hundreds, or more gigabytes (GB) of storage. The NVM memory array may be arranged in blocks and each block may include a plurality of sub-blocks. Each sub-block may include a plurality of memory cells and each sub-block may correspond to a write unit having a minimum write granularity. Thus, a sub-block corresponds to a minimum number of memory cells that are accessed during a write operation. For example, a block may include 16 sub-blocks and each sub-block may include 512 bytes, thus the block may include 8 kilobytes (kB) of storage. Continuing with this example, a 10 GB NVM may include about 1.25 million blocks and about 20 million sub-blocks.

A value of a demarcation voltage (VDM) for a read of a selected memory cell may be related to a time interval since a most recent write operation to the sub-block that contains the selected memory cell. For example, NVM memory cells may be read utilizing one of two demarcation voltages VDM1 or VDM2 as read reference voltages. A first demarcation voltage, VDM1, may be utilized to relatively reliably read a target memory cell relatively close in time (e.g., less than one second) to a most recent write to the sub-block that includes the target memory cell. A second demarcation voltage, VDM2, may be utilized to relatively reliably read the target memory cell at a time that is not relatively close in time to the most recent write. Utilizing VDM1 to read the target memory cell at a time that is not relatively close to the most recent write may not always be successful. Utilizing VDM2 to read the target memory cell at a time that is relatively close in time to the most recent write to the sub-block may corrupt data stored to the sub-block.

In some situations, in response to a read request for a target memory cell, an elapsed time since a most recent write to a target sub-block that includes the target memory cell may be determined. The elapsed time is configured to indicate whether a time interval duration since the most recent write to the target sub-block is greater than or equal to a minimum time duration. If the time interval duration is greater than or equal to the minimum time duration, then VDM2 may be used for the read operation. The elapsed time may then be utilized to select between VDM1 or VDM2. For example, a current elapsed time for a sub-block since a most recent write to the sub-block or a corresponding block that contains the sub-block, may be determined. The current elapsed time may be determined based, at least in part, on a current timer index, a timestamp and an individual state associated with the sub-block. A timer circuitry has a time interval duration, i.e., a granularity, G. An actual time may correspond to the elapsed time multiplied by the timer granularity, G.

The timestamp may be associated with the sub-block and/or the block. The timestamp may thus correspond to a timer index of the most recent write the sub-block or to any sub-block contained in the block. The individual state of a given sub-block is configured to indicate whether the elapsed time from a most recent write to the sub-block is less than, or greater than or equal to, the minimum time duration for using VDM2. The individual state may be constrained to a threshold corresponding to a time duration of two clock periods of the timer circuitry. In other words, the threshold may be equal to 2. Utilizing individual states is configured to facilitate utilizing a respective timestamp for each sub-block. Utilizing one timestamp for a block is configured to reduce an amount of storage occupied by timestamps. Utilizing the individual states is configured to ensure adequate accuracy of an elapsed time determination and associated selection of an appropriate VDM for a read operation for a relatively coarse timer granularity.

A time interval ("overlap interval") since a most recent write may be defined where both VDM1 and VDM2 provide a relatively accurate read result without corrupting data stored in the sub-block. A lower bound of the overlap interval corresponds to a minimum actual time associated with VDM2 (VDM2Tmin) and an upper bound of the overlap interval corresponds to a maximum actual time associated with VDM1 (VDM1Tmax). VDM2 may be safely used for actual times greater than VDM2Tmin. VDM1 may provide a relatively reliable read result for actual times less than VDM1Tmax. Thus, VDM1 or VDM2 may be safely used during the overlap interval.

Outside the overlap interval, VDM1 may be safely used during a time interval with a duration less than VDM2Tmin and VDM2 may be safely used during a time interval with duration greater than VDM1Tmax. The overlap interval may facilitate utilizing a timer circuitry having a relatively coarse granularity to determine an elapsed time, as will be described in more detail below. Thus, an elapsed time since a most recent write operation to a sub-block may be used to select an appropriate demarcation voltage, e.g., VDM1 or VDM2, for a read operation.

A timer circuitry may be configured to provide a periodic clock signal that has a period, G. Each sequential period may be identified by a respective timer index, e.g., 0, 1, 2, 3, . . . , n−1. Thus, an actual time corresponds to the timer index multiplied by the period, G. The timer circuitry is configured to be relatively accurate but with a relatively coarse granularity, i.e., a relatively coarse period, G. In one example, G may be in the range of 1 microsecond to 1 year. In another example, G may be in the range of 0.1 second to 100 seconds. Utilizing the relatively coarse granularity is configured to reduce an amount of storage consumed by stored timestamps. The granularity may be constrained and/or may be related to VDM2Tmin and/or VDM1Tmax. In an embodiment, the granularity, G, may be greater than VDM2Tmin and 2*G may be less than VDM1Tmax. Thus, for a read operation at an actual time from a most recent write that is between G and 2G, VDM1 or VDM2 may be safely used.

In operation, in response to a write operation to a sub-block, the current timer index may be captured. The current timer index may then correspond to a timestamp of the write operation. The timestamp may be associated with the sub-block or the block that includes the sub-block and stored in a timestamp store. The individual state of the sub-block may be set to zero in response to the write. The individual state of the sub-block may be incremented in response to subsequent writes to other sub-blocks included in the block, if the corresponding timestamp changes in response to the write and the state of the sub-block is less than a threshold, e.g., 2. In other words, if two writes occur during a same timer period so that the captured timestamp is the same for the two writes, the state of the first written to sub-block is configured to remain unchanged in response to the write to the second sub-block. Retaining the state of the first written to sub-block unchanged in response to a write to a second associated sub-block during the same timer interval is configured to ensure that a determined minimum actual time for each sub-block is greater than VDM2Tmin. In other words, two writes to two sub-blocks included in the same block, that occur during the same timer period, may introduce an ambiguity in the elapsed time determinations partly due to the granularity of the timer circuitry. Constraining incrementing of corresponding states to situations where the associated timestamp changes is configured to manage this ambiguity.

In response to a read request to a target memory cell, an elapsed time since a most recent write to a sub-block that includes the target memory cell may be determined. For example, the elapsed time may be determined as:

elapsed time=current timer index−timestamp for the target sub-block or the block that contains the target sub-block+individual state of the target sub-block.

The individual state of the target sub-block may be determined based, at least in part, on a stored individual state or a stored composite state. If the elapsed time is greater than or equal to the minimum elapsed time, then VDM2 may be selected as the read reference voltage. If the elapsed time is less than the minimum elapsed time, then VDM1 may be selected as the read reference voltage.

Thus, a timer index, a timestamp and a state may be utilized to determine whether a minimum elapsed time (and corresponding minimum actual time) has been reached between a most recent write operation and a current read operation. If the minimum elapsed time has been reached, then VDM2 may be selected for the read operation. If the minimum elapsed time has not been reached, then VDM1 may be selected for the read operation. The minimum elapsed time corresponds to an actual time greater than VDM2Tmin.

The timer index has values in the range of 0 to n−1, where n is a number of bits of the timer circuitry. Thus, the timer index and the timestamps may each contain n bits. In one nonlimiting example, n may be 5 and the corresponding timer index may then range from 0 to 31. In other examples, n may be greater than 5 or less the 5. In operation, the timer circuitry is configured to count around. In other words, a timer index of zero is configured to follow a timer index of n−1. Thus, zero corresponds to a timer index minimum value and n−1 corresponds to a timer index maximum value.

Whether the timer circuitry has counted around since a last timestamp was determined may affect elapsed time determinations. If a time interval between a write to a sub-block and a read of the sub-block is long enough for the timer circuitry to count around, the current timer index at the read may be less than or equal to the store timestamp for the sub-block. If the corresponding state has not been incremented and is less than the threshold, VDM1 may be selected when VDM2 could be used.

Generally, this disclosure relates to time tracking using patrol scrub. An apparatus, method and/or system are configured to utilize a patrol scrub to periodically update a state of a sub-block. The state may be updated if the state is less than the threshold and the difference between a current timer index and the stored timestamp is nonzero.

Patrol scrub is initiated periodically at each interval boundary of a patrol scrub interval. For an n-bit timer circuitry, the patrol scrub interval duration is configured to be less than $2^n$ times the timer granularity, G. Thus, at least one patrol scrub operation may be initiated during each time interval duration of $2^n*G$, and each respective state of each sub-block (not equal to the threshold) of a plurality of sub-blocks may be updated.

Patrol scrub is configured to detect and correct "soft errors" that may be present in data stored in a memory. Soft errors may be due to, for example, cosmic rays. Soft errors differ from hard errors that are related to memory circuitry failures. The patrol scrub interval is configured to facilitate detecting and correcting the soft errors before the number of soft errors exceeds a correction threshold. Relatively shorter patrol scrub intervals may thus correspond to a relatively smaller bit error rate for the memory.

Combining patrol scrub operations with time tracking operations is configured to conserve memory bandwidth and/or improve bit error rate for the associated memory. For example, triggering time tracking operations in response to initiation of periodic patrol scrub operations may not increase memory bandwidth consumption. In another example, decreasing the patrol scrub interval to support time tracking operations may result in an improved bit error rate for the associated memory due to the relatively more frequent error correction operations.

FIG. 1 illustrates a functional block diagram of a time tracking system 100 consistent with several embodiments of the present disclosure. System 100 may include a memory controller 102, a memory array 104, processor circuitry 108 and peripheral devices 110. The memory controller 102 includes a memory controller memory 106. Memory controller memory 106 may include volatile random-access memory, e.g., dynamic random access memory (DRAM), static random access memory (SRAM), etc. For example, processor circuitry 108 may correspond to a single core or a multi-core general purpose processor, such as those provided by Intel® Corp., etc. Peripheral device(s) 110 may include, but are not limited to, an external storage device (e.g., a hard disk drive (HDD), a solid-state drive (SDD)), a user interface (e.g., a keyboard, a mouse, a display, a touch sensitive display, etc.), etc.

Memory array 104 may be a non-volatile memory, e.g., a storage medium that does not require power to maintain the state of data stored by the storage medium. Nonvolatile memory may include, but is not limited to, a NAND flash memory (e.g., a Triple Level Cell (TLC) NAND or any other type of NAND (e.g., Single Level Cell (SLC), Multi Level Cell (MLC), Quad Level Cell (QLC), etc.)), NOR memory, solid state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random accessible 3D crosspoint memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D crosspoint memory may include a transistor-less stackable cross point architecture in which memory cells sit at the intersection of words lines and bit lines and are individually addressable and in which bit storage is based on a change in bulk resistance.

Memory array 104 may include a plurality of blocks Block 1, Block 2 . . . , Block M. For example, each block may include 4096 bytes (i.e., 4 kilobytes (kB)), 8192 bytes (i.e., 8 kB) or 16384 bytes (i.e., 16 kB) of storage. In other examples, each block may include more or fewer bytes of storage. Each block includes a plurality of sub-blocks. For example, Block 1 includes sub-blocks SB 1, SB 2, . . . , SB 16. In other examples, each block Block 1, Block 2 . . . , Block M may include more than 16 sub-blocks or fewer than 16 sub-blocks. Each sub-block may include a number of bytes of storage. For example, each sub-block may include 64, 128, 256 or 512 bytes of storage. In another example, each sub-block may include fewer than 64 bytes or more than 512 bytes. In some embodiments, each sub-block may correspond to a minimum write unit.

In some embodiments, a subset of sub-blocks may correspond to a group of sub-blocks. For example, a first group 140-1 may include SB 1, SB 2, SB 3 and SB 4; a second group 140-2 may include SB 5, SB 6, SB 7 and SB 8; a third group 140-3 may include SB 9, SB 10, SB 11 and SB 12; and a fourth group 140-4 may include SB 13, SB 14, SB 15 and SB 16. Thus, in this example, each group may include four sub-blocks. In another example, a first subset 140-6 of sub-blocks may include groups 140-1 and 140-2 and a second subset 140-7 of sub-blocks may include groups 140-3 and 140-4. Thus, in this example, each subset may include eight sub-blocks. In another example, each group may include more than four or fewer than four sub-blocks. In another example, each subset may include more than eight or fewer than eight sub-block. The number of sub-blocks included in a group or subset is not limited to a power of two.

Memory controller memory 106 may include a state store 130 and a timestamp store 132. The state store 130 is configured to store a plurality of states S1, S2, S3, S4, . . . , SK−1, SK. In an embodiment, each state may correspond to a group state (i.e., composite state) of a group of sub-blocks. In an embodiment, each state may correspond to a state of a respective sub-block. A group state is configured to reduce an amount of memory controller memory occupied by the state store 130.

The timestamp store 132 is configured to store a plurality of timestamps TS 1, TS 2, . . . , TS N. In one embodiment, each timestamp may be associated with a respective block. For example, TS 1 may be associated with Block 1, TS 2 may be associated with Block 2, etc. In another embodiment, each timestamp may be associated with a respective sub-block. For example, TS 1 may be associated with SB 1, TS 2 may be associated with SB 2, etc. Each timestamp may correspond to a captured timer index of a most recent write to the associated block or sub-block, as will be described in more detail below. Initially, the timestamps TS 1, TS 2, . . . , TS N may be set to zero.

Memory controller 102 includes a timer circuitry 120, a timestamp circuitry 122, a VDM selection circuitry 124, a patrol scrub circuitry 126 and a read/write circuitry 118.

Timer circuitry 120 is configured to provide a periodic clock signal that has a period (i.e., timer interval), G. G may be in the range of 1 microsecond to 1 year. For example, G may be in the range of 1±0.1 second. In another example, G may be in the range of 0.1 second to 10 seconds. Each sequential timer interval may be identified by a respective timer index, e.g., 0, 1, 2, 3, . . . , n−1. For example, n may be in the range of 2 to 32. In another example, n may be greater than 32. For example, for n=5, corresponding to an 5 bit timer index, the index may have a maximum value of 31 ($2^5-1$) and a minimum value of zero. Thus, in a sequence of timer indexes, a timer index of 31 may be followed by a timer index of 0. The timer circuitry 120 is configured to be relatively accurate but with a relatively coarse granularity. The granularity corresponds to the timer interval, G. The relatively coarse granularity is configured to reduce an amount of storage consumed by state store 130 and timestamp store 132. The granularity is related to VDM2Tmin and VDM1Tmax, as described herein.

Patrol scrub circuitry 126 is configured to detect and correct "soft errors" that may be present in data stored in a memory, as described herein. For example, patrol scrub circuitry 126 may be configured to detect and correct soft errors that may be present in memory controller memory 106. Patrol scrub operations may be initiated periodically at each interval boundary of a patrol scrub interval. Sub-block states may then be updated in response to initiation of patrol scrub operations. In an embodiment, time stamp circuitry 122 may be configured to capture a current timer index in response to initiation of the periodic patrol scrub. For example, timestamp circuitry 122 may be configured to fetch a timestamp from timestamp store 132. Timestamp circuitry 122 may then compare a current timer index from timer circuitry 122 to the stored timestamp.

VDM selection circuitry 124 may then be configured to update a state of a sub-block, e.g., sub-block SB 1, if the state is less than the threshold and the difference between the current timer index and the stored timestamp is nonzero. For example, the updating may include incrementing the state, if the stored timestamp equals a timer index maximum value and the current timer index equals a timer index minimum value. In another example, the state may be incremented if the current timer index is equal to one plus the stored timestamp. In another example, the state may be set equal to the threshold (if the stored timestamp is not equal to the timer index maximum value and the current timer index is not equal to one plus the stored timestamp). The timestamp circuitry 122 may then be configured to store the current timer index as a new timestamp in, e.g., timestamp store 132.

Read/write circuitry 118 is configured to manage memory access operations (e.g., read, write and/or refresh) of memory controller 102 for memory array 104. For example, read/write circuitry 118 is configured to write data 112 received from processor circuitry 108 to memory array 104. In another example, read/write circuitry 118 is configured to read data 114 from memory array 104 and to provide the read data to processor 108. Memory controller 102 is further configured to provide an appropriate VDM, e.g., VDMx 116, where x is 1 or 2, to a selected sub-block of memory array 104 to facilitate a corresponding read operation.

A write operation may be initiated, for example, by a write request from processor circuitry 108 to write to memory array 104. Read/write circuitry 118 may be configured to identify and/or determine the block, e.g., Block 1, and a sub-block, e.g., SB 1, that is the target of the write request. Timestamp circuitry 122 is configured to capture a current timer index from timer circuitry 120 and temporarily store the captured current timer index as Index 123. Timestamp circuitry 122 may then be configured to fetch a timestamp for the target sub-block, or for the block that includes the target sub-block, from timestamp store 132. For example, for any of sub-blocks SB 1, SB 2, . . . , SB 16 included in Block 1, TS 1 may be fetched by timestamp circuitry 122.

VDM selection circuitry 124 may then be configured to fetch a state, e.g., 51, that represents a composite state of the Block 1 that includes the sub-block SB 1 or corresponds to the individual state of the target sub-block SB 1. VDM selection circuitry 124 may then be configured to update the composite state by setting the individual state corresponding to the target sub-block to zero.

Timestamp circuitry 122 may then be configured to determine whether the fetched timestamp, e.g., TS 1, is equal to the current timer index, Index 123. If the timestamp TS 1 is not equal to Index 123, then VDM selection circuitry 124 is configured to increment any other individual states in the composite state that are less than the threshold, i.e., that are less than 2. Other individual states that are equal to the threshold 2 may remain unchanged. If the timestamp TS 1 is equal to Index 123, then the other individual states in the composite state may remain unchanged. In some embodiments, if the Index 123 is greater than the timestamp TS 1 by 2 or more, then the respective states of sub-blocks other than SB 1 may be set to 2. Further, if the timestamp TS 1 is not equal to the current timer index, Index 123, then timestamp circuitry 122 may be configured to update the timestamp TS 1 and store Index 123 as TS 1 to timestamp store 132.

Thus, a composite state for a group (e.g., group 140-1) of sub-blocks in a block (e.g. Block 1) or an individual state in a target sub-block may be updated in response to a write to one of the sub-blocks (e.g., SB 1) included in the group 140-1.

A read operation may be initiated, for example, by a read request from processor circuitry 108 to read from memory array 104. In order to determine whether to use VDM1 or VDM2 as read reference voltage for the read operation, VDM selection circuitry 124 is configured to determine an elapsed time between a most recent write to the target sub-block and the current read operation. If the elapsed time is greater than or equal to the threshold, i.e., 2, then VDM selection circuitry 124 is configured to select VDM2. If the elapsed time is less than 2, then VDM selection circuitry 124 is configured to select VDM1.

Read/write circuitry 118 may be configured to identify and/or determine the block, e.g., Block 1, and a sub-block, e.g., SB 1, that is the target of the read request. VDM selection circuitry 124 is configured to determine a state, e.g., S1, of the target sub-block. For example, VDM selection circuitry 124 may fetch the state, S1, from state store 130. If the state is equal to the threshold, then VDM selection circuitry 124 may be configured to select VDM2. Read/write circuitry 118 may then be configured to perform the read of sub-block 51 using VDM2.

If the state, S1, of the target sub-block SB 1, is less than the threshold, VDM selection circuitry 124 may be configured to determine an elapsed time since a last write to SB 1 and/or the block (Block 1) that includes SB 1. Timestamp circuitry 122 is configured to capture a current timer index, e.g., Index 123, from timer circuitry 120. Timestamp circuitry 122 may then be configured to fetch a timestamp for the target sub-block, S1, or the block that includes the target sub-block, e.g., TS 1 for Block 1. VDM selection circuitry 124 may then be configured to determine whether the elapsed time, i.e., a difference between the index and the timestamp, plus the state, is greater than or equal to the threshold. If the elapsed time is greater than or equal to the threshold, then VDM2 may be selected. If the elapsed time is less than the threshold, then VDM selection circuitry 124 is configured to select VDM1. Thus, an appropriate demarcation voltage may be selected. Read/write circuitry 118 may then perform the read operation using the selected VDM.

Thus, an appropriate read reference voltage may be selected based, at least in part, on the current timer index, a timestamp and a target sub-block state. A granularity of the timer circuitry may be relatively coarse and a respective timestamp may be utilized for each block of memory array 104.

Figure 2:
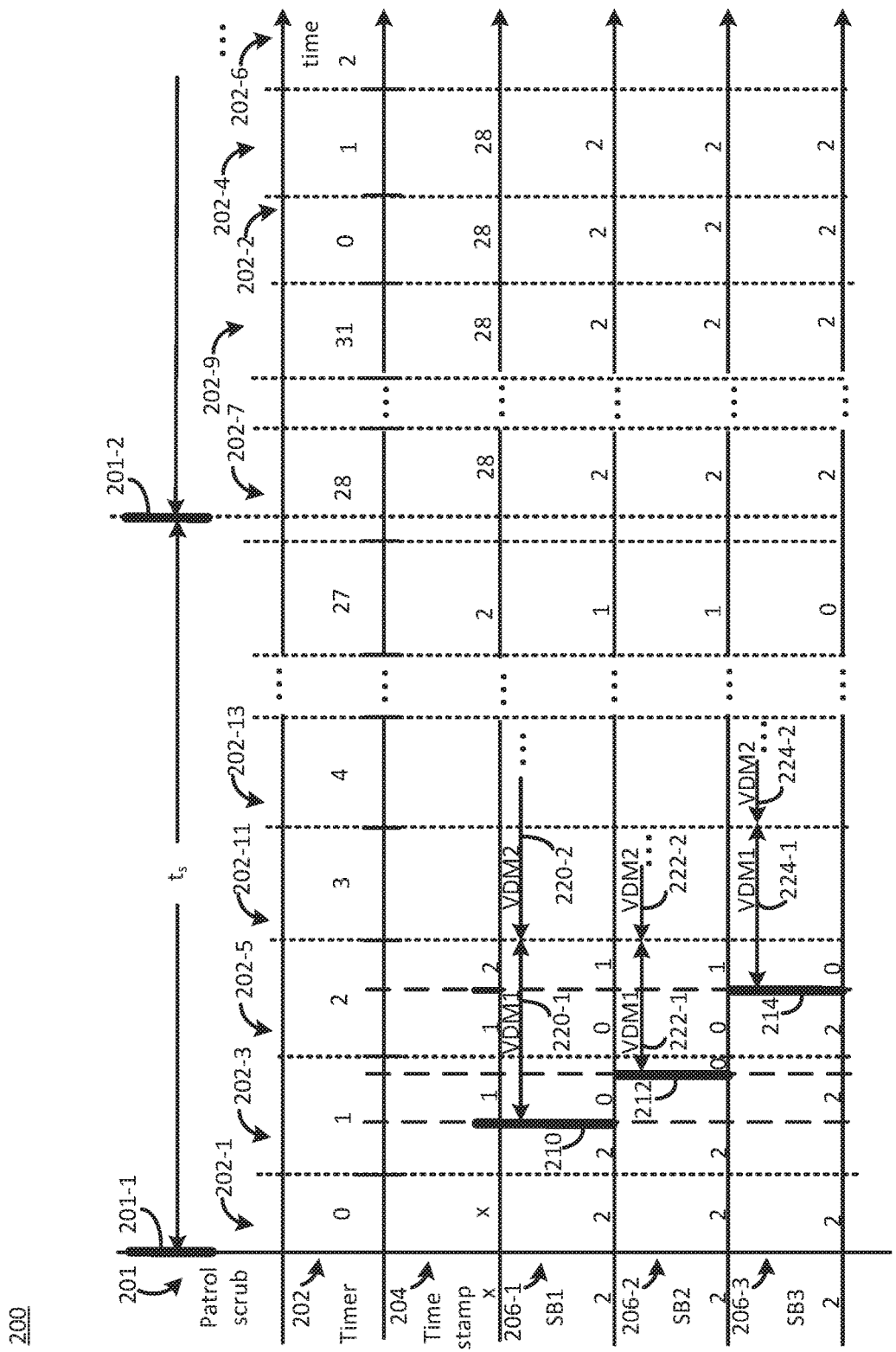
FIG. 2 is a timing diagram illustrating a periodic patrol scrub and sub-block states for a plurality of sub-blocks for example write operations, consistent with one embodiment of the present disclosure.

FIG. 2 is a timing diagram 200 illustrating sub-block states for a plurality of sub-blocks for example write operations, consistent with one embodiment of the present disclosure. In the timing diagram 200, the threshold is equal to 2. Timing diagram 200 includes a patrol scrub 201, a timer index 202, a timestamp 204, and individual state information 206-1, 206-2 and 206-3 for sub-blocks SB 1, SB 2 and SB 3, respectively.

The timer index 202 includes a plurality of intervals 202-1, 202-2, . . . , each of duration G. Each timer interval has a corresponding timer index. For example, timer interval 202-1 has a timer index of 0, timer interval 202-3 has a timer index of 1, timer interval 202-2 has a timer index of 0, etc. In this example, the timer circuitry corresponds to a 5 bit timer, thus, the timer index ranges from 0 to 31 and counts around so that timer interval 202-2 with timer index 0 follows timer interval 202-9 with timer index 31. In this example, initially, i.e., prior to timer interval 202-1, the respective individual states of each of the sub-blocks is 2. Initially, at the start of timer interval 202-1, a patrol scrub operation is initiated, indicated by the bold line 201-1.

Patrol scrub 201 includes periodic initiation of patrol scrub operations. For example, a first patrol scrub initiation 201-1 occurs at a start of the time interval 202-1 with timer index 0. A second patrol scrub initiation 201-2 occurs during timer interval 202-7 with timer index 28. A duration of a time interval between consecutive patrol scrub initiations, i.e., a patrol scrub interval, is, ts. The patrol scrub time interval duration, ts, is less than $2^n*G$, where n is the number of bits in the timer circuitry and, G is the granularity. In the example of FIG. 2, the number of timer bits, n, is five.

During timer interval 202-3 with the timer index 1, a write 210 to SB 1 occurs. As a result, state 206-1 of SB 1 is reset to 0 from 2 and the timestamp 204 is set to 1 to correspond to the timer index at the time of the write 210. Also during timer interval 202-3, but at a different instant in time, a write 212 to SB 2 occurs. As a result, the state 206-2 of SB 2 is reset to 0 from 2. The timestamp 204 is unchanged (i.e., is equal to 1) since, in response to a write, the timestamp is set equal to the timer index at the time of the write.

During timer interval 202-5 with a timer index 2, a write 214 to SB 3 occurs. As a result, state 206-3 of SB 3 is reset to 0 from 2 and the timestamp 204 is set to 2 to correspond to the timer index at the time of the write 214.

None of the individual states of SB 2 and SB 3 change in response to write 210 because the states are equal to 2. In other words, the individual state has a maximum value of 2 (i.e., the threshold in this example). Incrementing the individual state of a selected sub-block stops at 2. In this example, none of the individual states of SB 1 and SB 3 change in response to write 212 because the timestamp 204 does not change. In other words, since the write 212 occurs in the same timer interval 202-3 as the write 210, the timestamp 204 remains at 1. At write 214, the respective individual states of both SB 1 and SB 2 increment from 0 to 1.

In response to the second patrol scrub initiation 201-2, the states of SB1 and SB2 change from 1 to 2 and the state of SB3 changes from 0 to 2. In other words, a difference between the stored timestamp (equal to 2) and the timer index (equal to 28) is greater than the threshold (i.e., is greater than 2). Thus, the states of the sub-blocks may be updated to 2. The time stamp 204 may then be set to 28, i.e., the value of the timer index at the time the patrol scrub is initiated.

Timing diagram 200 further illustrates time intervals for each sub-block where VDM1 or VDM2 may be selected as a read reference voltage. VDM1 or VDM2 may be selected by VDM selection circuitry 124 based, at least in part, on the elapsed time. The elapsed time may be determined based, at least in part, on the current timer index, the timestamp for the block that includes the target sub-block and the individual state associated with the target sub-block, as described herein. The time intervals where VDM1 may be selected ("VDM1 time interval") correspond to an elapsed time of less than the threshold and time intervals where VDM2 may be selected ("VDM2 time interval") correspond to an elapsed time of greater than or equal to the threshold.

For SB 1 206-1, a VDM1 time interval 220-1 begins with write 210 and ends at the start of timer interval 202-11. During the VDM1 time interval 220-1, the elapsed time ranges from 0 (beginning with the write 210) to 1 (beginning at the boundary between timer interval 202-3 and timer interval 202-5 and ending at the boundary between timer interval 202-5 and timer interval 202-11). The elapsed time increases to 2 when the timer index increments from 2 to 3. A VDM2 time interval 220-2 begins when the VDM1 time interval 220-1 ends, i.e., when the timer index increments from 2 to 3.

For SB 2 206-2, a VDM1 time interval 222-1 begins with write 212 and ends at the start of timer interval 202-11. During the VDM1 time interval 222-1, the elapsed time ranges from 0 (beginning with the write 212) to 1 (beginning at the boundary between timer interval 202-3 and timer interval 202-5 and ending at the boundary between timer interval 202-5 and timer interval 202-11). A VDM2 time interval 222-2 corresponds to the VDM2 time interval 220-2.

For SB 3, a VDM1 time interval 224-1 begins with the write 214 and ends at the start of timer interval 4. The elapsed time during the VDM1 time interval 224-1 ranges from 0 (beginning with write 214) to 1 (beginning at the boundary between timer index 2 and timer index 3). A VDM2 time interval 224-2 begins when the VDM1 time interval 224-1 ends. The elapsed time for SB 3 transitions to 2 at the boundary between timer interval 202-11 and timer interval 202-13. In other words, when the timer index increments from 3 to 4, the current timer index (i.e., 4) minus the timestamp of last write to the block that contains SB 3 (i.e., 3)+the individual state associated with SB 3 (i.e., 1) equals the elapsed time (i.e., 2).

Determination of an elapsed time for a read operation may be affected by counting around of timer circuitry 120 and thus timer index 202. For example, without the operations associated with the periodic patrol scrub, as described herein, a read of sub-block SB 3 during timer interval 202-6 may result in selection of VDM1 when VDM2 could be used. In other words, without updating the state 206-3 of sub-block SB 3, the state 206-3 may remain at zero, if there are no write operations between timer interval 202-5 and timer interval 202-6. Thus, the termination of the elapsed time as timer index minus timestamp plus state equals 2−2+0=0. Since the elapsed time is less than the threshold, VDM1 may be selected for the read operation.

Continuing with this example, but with updating the state 206-3 to the threshold in response to initiation of the patrol scrub at the patrol scrub interval boundary 201-2, VDM2 may be selected based on the state 206-3, i.e., 2.

The state of a sub-block may be updated in response to initiation of the periodic patrol scrub if the state is less than the threshold and the difference between the current timer index and the stored timestamp is nonzero. For example, if the stored timestamp equals the timer index maximum value and the current timer index equals a time index minimum value, the corresponding state may be incremented. In another example, if the current timer index is equal to one plus the stored timestamp, the corresponding state may be incremented. In other words, if a write occurs in the timer interval corresponding to the timer index maximum value (setting the timestamp to the timer index maximum value) and a periodic patrol scrub is initiated in the next timer interval (corresponding to the timer index minimum value), a nonzero state may be incremented. Thus, a read that follows the initiation of the periodic patrol scrub in the same time interval and/or in less than two time intervals may utilize the appropriate VDM.

In another example, the state may be set to the threshold, e.g., 2, if the stored timestamp is not equal to the timer index maximum value and/or the current time index is not equal to one plus the stored timestamp. Thus, updating the state may include setting the state to the threshold or incrementing the state.

Thus, initiation of a periodic patrol scrub may be utilized to trigger an update of each state of a plurality of states corresponding to a plurality of sub-blocks. Thus, counting around by a timer circuitry with the granularity, G, and a limited number of bits, may be accommodated. An amount of memory consumed by storing timestamps may be limited and an appropriate VDM may be selected for a read operation based, at least in part, on the state, current timer index and/or a stored timestamp.

FIG. 3 is a flowchart 300 of time tracking with patrol scrub operations according to various embodiments of the present disclosure. In particular, the flowchart 300 illustrates utilizing a periodic patrol scrub to trigger updating a state of a sub-block. The operations may be performed, for example, by elements of memory controller 102, e.g., read/write circuitry 118, timer circuitry 120, timestamp circuitry 122, VDM selection circuitry 124 and patrol scrub circuitry 126, of FIG. 1.

Operations of this embodiment may begin in response to initiation of a patrol scrub at operation 302. A current timer index may be captured in response to initiation of the periodic patrol scrub at operation 304. Operation 306 may include comparing the current timer index to a stored timestamp. A respective state of each sub-block for each state not equal to the threshold, may be updated based, at least in part, on the comparison, at operation 308. For example, the state of a sub-block may be updated, if the state is less than the threshold and a difference between the current timer index and the stored timestamp is nonzero. The current timer index may be stored as a new timestamp at operation 310. Program flow may then continue at operation 312.

Thus, initiation of a periodic patrol scrub may be utilized to trigger an update of a respective state of one or more sub-blocks.

FIG. 4 is a flowchart 400 of time tracking write operations according to various embodiments of the present disclosure. In particular, the flowchart 400 illustrates updating a respective state of one or more sub-blocks in response to a write request. The operations may be performed, for example, by elements of memory controller 102, e.g., read/write circuitry 118, timer circuitry 120, timestamp circuitry 122, VDM selection circuitry 124 and patrol scrub circuitry 126, of FIG. 1.

Operations of this embodiment may initiated in response to a write request at operation 402. A current timer index may be captured at operation 404. A state of a target memory sub-block (i.e., the target of the write operation) may be reset to zero at operation 406. A respective state of one or more other sub-blocks may be updated, if the respective state is less than the threshold, at operation 408. The current timer index may be stored as a new timestamp at operation 410. Program flow may then continue at operation 412.

Thus, a state may be updated in response to a write operation.

Figure 5:
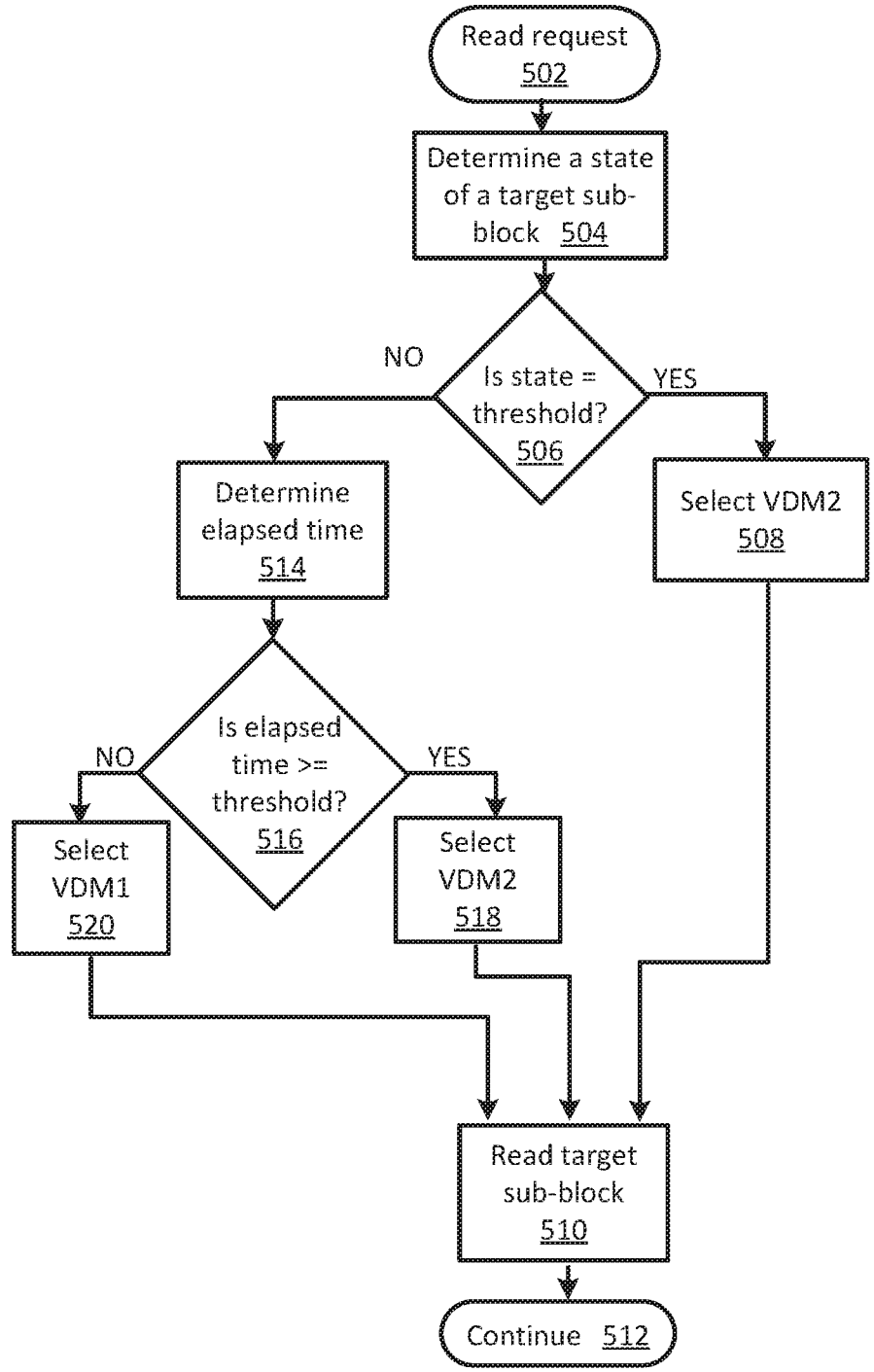
FIG. 5 is a flowchart of time tracking read operations according to various embodiments of the present disclosure.

FIG. 5 is a flowchart 500 of time tracking read operations according to various embodiments of the present disclosure. In particular, the flowchart 500 illustrates selecting a read reference voltage based, at least in part, on an elapsed time since a most recent write to a target sub-block. The operations may be performed, for example, by elements of memory controller 102 (e.g., timer circuitry 120, timestamp circuitry 122, VDM selection circuitry 124, patrol scrub circuitry 126 and/or read/write circuitry 118) of FIG. 1.

Operations of this embodiment may be initiated in response to a read request at operation 502. A state of a target sub-block may be determined at operation 504. Whether the state is equal to a threshold may be determined at operation 506. If the state is equal to the threshold, demarcation voltage VDM2 may be selected at operation 508. The target sub-block may then be read, utilizing VDM2, at operation 510. Program flow may then continue at operation 512.

If the state is not equal to the threshold, an elapsed time may be determined at operation 514. For example, determining the elapsed time may include capturing a current timer index, retrieving a timestamp, retrieving the state of the target sub-block and determining the elapsed time as: current timer index minus timestamp plus state. Whether the elapsed time is greater than or equal to the threshold may be determined at operation 516. If the elapsed time is greater than or equal to the threshold, then VDM2 may be selected as a demarcation voltage at operation 518. Program flow may then proceed to operation 510. If the elapsed time is not greater than or equal to the threshold (i.e., if the elapsed time is less than the threshold), then VDM1 may be selected at operation 520. Program flow may then proceed to operation 510.

Thus, an appropriate read reference voltage may be selected based, at least in part, on an elapsed time.

While the flowcharts of FIGS. 3, 4 and 5 illustrate operations according various embodiments, it is to be understood that not all of the operations depicted in FIGS. 3, 4 and 5 are necessary for other embodiments. In addition, it is fully contemplated herein that in other embodiments of the present disclosure, the operations depicted in FIGS. 3, 4 and/or 5 and/or other operations described herein may be combined in a manner not specifically shown in any of the drawings, and such embodiments may include less or more operations than are illustrated in FIGS. 3, 4 and 5. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hard-wired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, by the processors 108 executing code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) may be configured to manage system resources and control tasks that are run on, e.g., system 100. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement a protocol stack. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

Memory 106, 104 may each include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to time tracking with patrol scrub, as discussed below.

Example 1

According to this example, there is provided a memory controller. The memory controller includes a memory controller memory; a timestamp circuitry; and a demarcation voltage (VDM) selection circuitry. The timestamp circuitry is to capture a current timer index from a timer circuitry in response to an initiation of a periodic patrol scrub and to compare the current timer index to a stored timestamp. The VDM selection circuitry is to update a state of a sub-block of a memory array, if the state is less than a threshold and a difference between the current timer index and the stored timestamp is nonzero. The timestamp circuitry is further to store the current timer index as a new timestamp.

Example 2

This example includes the elements of example 1, wherein the updating includes incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

Example 3

This example includes the elements of example 1, wherein the VDM selection circuitry is to set the state to zero in response to a write request.

Example 4

This example includes the elements of example 1, wherein the VDM selection circuitry is to select a demarcation voltage based, at least in part, on the state, in response to a read request.

Example 5

This example includes the elements according to any one of examples 1 to 4, wherein the VDM selection circuitry is to determine an elapsed time in response to a read request, if the state is less than the threshold, as: elapsed time=current timer index−timestamp+state.

Example 6

This example includes the elements of example 5, wherein the VDM selection circuitry is to select a first VDM, VDM1, if the elapsed time is less than the threshold or a second VDM, VDM2, if the elapsed time is greater than or equal to the threshold.

Example 7

This example includes the elements according to any one of examples 1 to 4, further including a patrol scrub circuitry to perform a periodic patrol scrub operation on the memory controller memory, the patrol scrub operation initiated at a patrol scrub interval boundary.

Example 8

This example includes the elements according to any one of examples 1 to 4, wherein the VDM selection circuitry is to update a respective state of each of a plurality of sub-blocks included in a memory array, if each respective state is not equal to the threshold and the difference between the current timer index and the stored timestamp is nonzero, a combination of the plurality of states corresponding to a composite state.

Example 9

This example includes the elements according to any one of examples 1 to 4, wherein the timer circuitry is an n-bit timer and a time duration of the patrol scrub interval is less than $2^n$ times a timer granularity.

Example 10

This example includes the elements of example 9, wherein n is equal to 5 and the threshold is equal to 2.

Example 11

According to this example, there is provided a method. The method includes capturing, by a timestamp circuitry, a current timer index from a timer circuitry in response to an initiation of a periodic patrol scrub; comparing, by the timestamp circuitry, the current timer index to a stored timestamp; updating, by a demarcation voltage (VDM) selection circuitry, a state of a sub-block of a memory array, if the state is less than a threshold and a difference between the current timer index and the stored timestamp is nonzero; and storing, by the timestamp circuitry, the current timer index as a new timestamp.

Example 12

This example includes the elements of example 11, wherein the updating includes incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

Example 13

This example includes the elements of example 11, further including setting, by the VDM selection circuitry, the state to zero in response to a write request.

Example 14

This example includes the elements of example 11, further including selecting, by the VDM selection circuitry, a demarcation voltage based, at least in part, on the state, in response to a read request.

Example 15

This example includes the elements of example 11, further including determining, by the VDM selection circuitry, an elapsed time in response to a read request, if the state is less than the threshold, as: elapsed time=current timer index−timestamp+state.

Example 16

This example includes the elements of example 15, further including selecting, by the VDM selection circuitry, a first VDM, VDM1, if the elapsed time is less than the threshold or a second VDM, VDM2, if the elapsed time is greater than or equal to the threshold.

Example 17

This example includes the elements of example 11, further including performing, by a patrol scrub circuitry, a periodic patrol scrub operation on the memory controller memory, the patrol scrub operation initiated at a patrol scrub interval boundary.

Example 18

This example includes the elements of example 11, further including updating, by the VDM selection circuitry, a respective state of each of a plurality of sub-blocks included in a memory array, if each respective state is not equal to the threshold and the difference between the current timer index and the stored timestamp is nonzero, a combination of the plurality of states corresponding to a composite state.

Example 19

This example includes the elements of example 11, wherein the timer circuitry is an n-bit timer and a time duration of the patrol scrub interval is less than $2^n$ times a timer granularity.

Example 20

This example includes the elements of example 19, wherein n is equal to 5 and the threshold is equal to 2.

Example 21

According to this example, there is provided a time tracking system. The time tracking system includes a processor circuitry; a memory array; and a memory controller. The memory controller includes a memory controller memory; a timestamp circuitry; and a demarcation voltage (VDM) selection circuitry. The timestamp circuitry is to capture a current timer index from a timer circuitry in response to an initiation of a periodic patrol scrub and to compare the current timer index to a stored timestamp. The VDM selection circuitry is to update a state of a sub-block of a memory array, if the state is less than a threshold and a difference between the current timer index and the stored timestamp is nonzero. The timestamp circuitry is further to store the current timer index as a new timestamp.

Example 22

This example includes the elements of example 21, wherein the updating includes incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

Example 23

This example includes the elements of example 21, wherein the VDM selection circuitry is to set the state to zero in response to a write request.

Example 24

This example includes the elements of example 21, wherein the VDM selection circuitry is to select a demarcation voltage based, at least in part, on the state, in response to a read request.

Example 25

This example includes the elements according to any one of examples 21 to 24, wherein the VDM selection circuitry is to determine an elapsed time in response to a read request, if the state is less than the threshold, as: elapsed time=current timer index−timestamp+state.

Example 26

This example includes the elements of example 25, wherein the VDM selection circuitry is to select a first VDM, VDM1, if the elapsed time is less than the threshold or a second VDM, VDM2, if the elapsed time is greater than or equal to the threshold.

Example 27

This example includes the elements according to any one of examples 21 to 24, further including a patrol scrub circuitry to perform a periodic patrol scrub operation on the memory controller memory, the patrol scrub operation initiated at a patrol scrub interval boundary.

Example 28

This example includes the elements according to any one of examples 21 to 24, wherein the VDM selection circuitry is to update a respective state of each of a plurality of sub-blocks included in the memory array, if each respective state is not equal to the threshold and the difference between the current timer index and the stored timestamp is nonzero, a combination of the plurality of states corresponding to a composite state.

Example 29

This example includes the elements according to any one of examples 21 to 24, wherein the timer circuitry is an n-bit timer and a time duration of the patrol scrub interval is less than $2^t$ times a timer granularity.

Example 30

This example includes the elements of example 29, wherein n is equal to 5 and the threshold is equal to 2.

Example 31

According to this example, there is provided a computer readable storage device. The device has stored thereon instructions that when executed by one or more processors result in the following operations including: capturing a current timer index from a timer circuitry in response to an initiation of a periodic patrol scrub; comparing the current timer index to a stored timestamp; updating a state of a sub-block of a memory array, if the state is less than a threshold and a difference between the current timer index and the stored timestamp is nonzero; and storing the current timer index as a new timestamp.

Example 32

This example includes the elements of example 31, wherein the updating includes incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

Example 33

This example includes the elements of example 31, wherein the instructions that when executed by one or more processors results in the following additional operations including setting the state to zero in response to a write request.

Example 34

This example includes the elements of example 31, wherein the instructions that when executed by one or more processors results in the following additional operations including selecting a demarcation voltage based, at least in part, on the state, in response to a read request.

Example 35

This example includes the elements according to any one of examples 31 to 34, wherein the instructions that when executed by one or more processors results in the following additional operations including determining an elapsed time in response to a read request, if the state is less than the threshold, as: elapsed time=current timer index−timestamp+state.

Example 36

This example includes the elements of example 35, wherein the instructions that when executed by one or more processors results in the following additional operations including selecting, a first VDM (demarcation voltage), VDM1, if the elapsed time is less than the threshold or a second VDM, VDM2, if the elapsed time is greater than or equal to the threshold.

Example 37

This example includes the elements according to any one of examples 31 to 34, wherein the instructions that when executed by one or more processors results in the following additional operations including performing a periodic patrol scrub operation on the memory controller memory, the patrol scrub operation initiated at a patrol scrub interval boundary.

Example 38

This example includes the elements according to any one of examples 31 to 34, wherein the instructions that when executed by one or more processors results in the following additional operations including updating a respective state of each of a plurality of sub-blocks included in a memory array, if each respective state is not equal to the threshold and the difference between the current timer index and the stored timestamp is nonzero, a combination of the plurality of states corresponding to a composite state.

Example 39

This example includes the elements according to any one of examples 31 to 34, wherein the timer circuitry is an n-bit timer and a time duration of the patrol scrub interval is less than $2^n$ times a timer granularity.

Example 40

This example includes the elements of example 39, wherein n is equal to 5 and the threshold is equal to 2.

Example 41

According to this example, there is provided a device. The device includes means for capturing, by a timestamp circuitry, a current timer index from a timer circuitry in response to an initiation of a periodic patrol scrub; means for comparing, by the timestamp circuitry, the current timer index to a stored timestamp; means for updating, by a demarcation voltage (VDM) selection circuitry, a state of a sub-block of a memory array, if the state is less than a threshold and a difference between the current timer index and the stored timestamp is nonzero; and means for storing, by the timestamp circuitry, the current timer index as a new timestamp.

Example 42

This example includes the elements of example 41, wherein the updating includes incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

Example 43

This example includes the elements of example 41, further including means for setting, by the VDM selection circuitry, the state to zero in response to a write request.

Example 44

This example includes the elements of example 41, further including selecting, by the VDM selection circuitry, a demarcation voltage based, at least in part, on the state, in response to a read request.

Example 45

This example includes the elements according to any one of examples 41 to 44, further including means for determining, by the VDM selection circuitry, an elapsed time in response to a read request, if the state is less than the threshold, as: elapsed time=current timer index−timestamp+state.

Example 46

This example includes the elements of example 45, further including means for selecting, by the VDM selection circuitry, a first VDM, VDM1, if the elapsed time is less than the threshold or a second VDM, VDM2, if the elapsed time is greater than or equal to the threshold.

Example 47

This example includes the elements according to any one of examples 41 to 44, further including means for performing, by a patrol scrub circuitry, a periodic patrol scrub operation on the memory controller memory, the patrol scrub operation initiated at a patrol scrub interval boundary.

Example 48

This example includes the elements according to any one of examples 41 to 44, further including means for updating, by the VDM selection circuitry, a respective state of each of a plurality of sub-blocks included in a memory array, if each respective state is not equal to the threshold and the difference between the current timer index and the stored timestamp is nonzero, a combination of the plurality of states corresponding to a composite state.

Example 49

This example includes the elements according to any one of examples 41 to 44, wherein the timer circuitry is an n-bit timer and a time duration of the patrol scrub interval is less than $2^n$ times a timer granularity.

Example 50

This example includes the elements of example 49, wherein n is equal to 5 and the threshold is equal to 2.

Example 51

According to this example, there is provided a system. The system includes at least one device arranged to perform the method of any one of examples 11 to 20.

Example 52

According to this example, there is provided a device. The device includes means to perform the method of any one of examples 11 to 20.

Example 53

According to this example, there is provided a computer readable storage device. The device has stored thereon instructions that when executed by one or more processors result in the following operations including: the method according to any one of examples 11 to 20.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A memory controller comprising:
   a memory controller memory;
   a timestamp circuitry to capture a current timer index from a timer circuitry in response to an initiation of a periodic patrol scrub and to compare the current timer index to a stored timestamp; and
   a demarcation voltage (VDM) selection circuitry to update a state of a sub-block of a memory array, if the state is less than a threshold and a difference between the current timer index and the stored timestamp is nonzero,
   the timestamp circuitry further to store the current timer index as a new timestamp.

2. The memory controller of claim 1, wherein the updating comprises incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

3. The memory controller of claim 1, wherein the VDM selection circuitry is to set the state to zero in response to a write request.

4. The memory controller of claim 1, wherein the VDM selection circuitry is to select a demarcation voltage based, at least in part, on the state, in response to a read request.

5. The memory controller of claim 1, wherein the VDM selection circuitry is to determine an elapsed time in response to a read request, if the state is less than the threshold, as: elapsed time=current timer index−timestamp+state.

6. The memory controller of claim 1, further comprising a patrol scrub circuitry to perform a periodic patrol scrub operation on the memory controller memory, the periodic patrol scrub operation initiated at a patrol scrub interval boundary.

7. The memory controller of claim 1, wherein the VDM selection circuitry is to update a respective state of each of a plurality of sub-blocks included in a memory array, if each respective state is not equal to the threshold and the difference between the current timer index and the stored timestamp is nonzero, a combination of a plurality of states corresponding to a composite state.

8. The memory controller of claim 1, wherein the timer circuitry is an n-bit timer and a time duration of the periodic patrol scrub is less than $2^n$ times a timer granularity.

9. A method comprising:
   capturing, by a timestamp circuitry, a current timer index from a timer circuitry in response to an initiation of a periodic patrol scrub;
   comparing, by the timestamp circuitry, the current timer index to a stored timestamp;
   updating, by a demarcation voltage (VDM) selection circuitry, a state of a sub-block of a memory array, if the state is less than a threshold and a difference between the current timer index and the stored timestamp is nonzero; and
   storing, by the timestamp circuitry, the current timer index as a new timestamp.

10. The method of claim 9, wherein the updating comprises incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

11. The method of claim 9, further comprising setting, by the VDM selection circuitry, the state to zero in response to a write request.

12. The method of claim 9, further comprising selecting, by the VDM selection circuitry, a demarcation voltage based, at least in part, on the state, in response to a read request.

13. The method of claim 9, further comprising determining, by the VDM selection circuitry, an elapsed time in response to a read request, if the state is less than the threshold, as: elapsed time=current timer index−timestamp+state.

14. The method of claim 9, further comprising performing, by a patrol scrub circuitry, a periodic patrol scrub operation on a memory controller memory, the periodic patrol scrub operation initiated at a patrol scrub interval boundary.

15. The method of claim 9, further comprising updating, by the VDM selection circuitry, a respective state of each of a plurality of sub-blocks included in a memory array, if each respective state is not equal to the threshold and the difference between the current timer index and the stored timestamp is nonzero, a combination of a plurality of states corresponding to a composite state.

16. The method of claim 9, wherein the timer circuitry is an n-bit timer and a time duration of the periodic patrol scrub is less than $2^n$ times a timer granularity.

17. A time tracking system comprising:
   a processor circuitry;
   a memory array; and
   a memory controller comprising:
      a memory controller memory,
      a timestamp circuitry to capture a current timer index from a timer circuitry in response to an initiation of a periodic patrol scrub and to compare the current timer index to a stored timestamp; and
      a demarcation voltage (VDM) selection circuitry to update a state of a sub-block of a memory array, if the state is less than a threshold and a difference between the current timer index and the stored timestamp is nonzero,
      the timestamp circuitry further to store the current timer index as a new timestamp.

18. The time tracking system of claim 17, wherein the updating comprises incrementing the state if the stored timestamp equals a timer index maximum value and the current timer index equals a timer index minimum value or the current timer index is equal to one plus the stored timestamp, or setting the state to the threshold, if the stored timestamp is not equal to the timer index maximum value and the current timer index is not equal to one plus the stored timestamp.

19. The time tracking system of claim 17, wherein the VDM selection circuitry is to set the state to zero in response to a write request.

20. The time tracking system of claim 17, wherein the VDM selection circuitry is to select a demarcation voltage based, at least in part, on the state, in response to a read request.

21. The time tracking system of claim 17, wherein the VDM selection circuitry is to determine an elapsed time in response to a read request, if the state is less than the threshold, as: elapsed time=current timer index−timestamp+state.

22. The time tracking system of claim 17, further comprising a patrol scrub circuitry to perform a periodic patrol scrub operation on the memory controller memory, the periodic patrol scrub operation initiated at a patrol scrub interval boundary.

23. The time tracking system of claim 17, wherein the VDM selection circuitry is to update a respective state of each of a plurality of sub-blocks included in the memory array, if each respective state is not equal to the threshold and the difference between the current timer index and the stored timestamp is nonzero, a combination of a plurality of states corresponding to a composite state.

24. The time tracking system of claim 17, wherein the timer circuitry is an n-bit timer and a time duration of the periodic patrol scrub is less than $2^n$ times a timer granularity.

* * * * *